United States Patent
Yamamoto et al.

(10) Patent No.: US 7,145,397 B2
(45) Date of Patent: Dec. 5, 2006

(54) OUTPUT OVERVOLTAGE PROTECTION CIRCUIT FOR POWER AMPLIFIER

(75) Inventors: Kazuya Yamamoto, Tokyo (JP); Teruyuki Shimura, Tokyo (JP); Tomoyuki Asada, Tokyo (JP); Satoshi Suzuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 29 days.

(21) Appl. No.: 10/889,059

(22) Filed: Jul. 13, 2004

(65) Prior Publication Data

US 2005/0030106 A1 Feb. 10, 2005

(30) Foreign Application Priority Data

Aug. 8, 2003 (JP) ............................. 2003-289815

(51) Int. Cl.
*H03F 1/52* (2006.01)
(52) U.S. Cl. .................................... 330/298
(58) Field of Classification Search ............ 330/207 P, 330/298; 455/117
See application file for complete search history.

(56) References Cited

U.S. PATENT DOCUMENTS

| | | | |
|---|---|---|---|
| 4,949,697 A | 8/1990 | Ookawa | 123/644 |
| 6,278,326 B1 * | 8/2001 | Murray et al. | 330/288 |
| 6,278,328 B1 | 8/2001 | Yamamoto et al. | 330/298 |
| 6,323,703 B1 | 11/2001 | Fotouhi | 327/112 |
| 6,545,541 B1 * | 4/2003 | Pehlke et al. | 330/296 |
| 6,580,321 B1 | 6/2003 | Arell et al. | 330/207 P |
| 6,701,138 B1 * | 3/2004 | Epperson et al. | 455/127.3 |
| 6,720,831 B1 * | 4/2004 | Dening et al. | 330/298 |
| 6,990,323 B1 * | 1/2006 | Prikhodko et al. | 455/126 |
| 2002/0024390 A1 | 2/2002 | Yamashita et al. | 330/298 |

FOREIGN PATENT DOCUMENTS

| | | |
|---|---|---|
| DE | 100 00 224 A1 | 12/2000 |
| JP | 2000-341052 | 12/2000 |
| JP | 2002-76791 | 3/2002 |
| JP | 2003-78362 | 3/2003 |

* cited by examiner

*Primary Examiner*—Steven J. Mottola
(74) *Attorney, Agent, or Firm*—Oblon, Spivak, McClelland, Maier & Neustadt, P.C.

(57) ABSTRACT

Disclosed is an output overvoltage protection circuit for a power amplifier having a plurality of stages, which comprises a monitor circuit for monitoring an output overvoltage of an output transistor in the final stage of the power amplifier and allowing a current to flow therethrough in response to the monitored output overvoltage, and a current mirror circuit for supplying a current proportional to the current from the monitor circuit in such a manner that the base bias of the first-stage transistor of the power amplifier is reduced in response to the current supplied from the current mirror circuit, to reduce the output of the final-stage output transistor.

10 Claims, 15 Drawing Sheets

OUTPUT OVERVOLTAGE PROTECTION CIRCUIT FOR POWER AMPLIFIER

BACKGROUND OF THE INVENTION

1. Field of the Invention

The present invention relates to a power amplifier, such as GaAs HBT or Si bipolar transistor power amplifier, and more particularly to a protection circuit for preventing the breakdown of an output-stage transistor of a power amplifier during load change (during output load mismatch) in output overvoltage conditions.

2. Description of the Related Art

In power amplifiers for mobile communication, a GaAs MESFET, GaAs HEMT and GaAs-based HBT are expected as future power elements for mobile communication, by reason that they have the following advantages as compared to a conventional FET:

(1) Capability of single power-supply operation because of no need for negative gate bias voltage;

(2) Capability of ON/OFF operation without any analog switch on drain side as with a Si-MOSFET; and (3) Capability of providing high output current density and facilitating the reduction in size required for obtaining a desired output as compared to a FET power amplifier.

By utilizing these features, a HBT (Heterojunction Bipolar Transistor) is becoming increasingly widely used in 2W–4W high power portable telephones, such as European GSM (Global System for Mobile Communication: currently most widely used 900 MHz band portable telephone system), in place of a Si-MOSFET which has been primarily used therein.

In the GSM application, a power amplifier is used in such a manner that a power supply terminal thereof is connected directly to a battery power supply without interposition of any voltage regulator. In addition, for the purpose of downsizing, any isolator for suppressing the variation in load impedance of the power amplifier due to fluctuation in output impedance from an antenna terminal is not used between an output terminal of the power amplifier and the antenna end (portable telephones (PDC: Personal Digital Cellular) in Japan generally employ an isolator).

Consequently, if a load impedance is changed to a value far greater than a usual value of 50 Ω when a power supply voltage is increased to a value (e.g. 4.5 V to 5.5 V) greater than a recommended operating condition (3 V to 3.6 V) during battery charge, a load curve of a final-stage transistor will be significantly changed, resulting in thermal breakdown of the final-stage transistor.

Generally, attempts to obtain enhanced current gain or reduced parasitic resistance/capacitance in order to improve transistor characteristics at a low voltage (nominal operating voltage: 3V to 3.6 V) in a portable telephone to be designed for low-voltage operation are apt to cause deterioration in tolerance on Vce (safe operation range). Therefore, portable telephone systems, such as GSM, where the fluctuation or change in power supply voltage or load has direct impact on a power amplifier have seriously suffered from the aforementioned problem of transistor breakdown.

There has been known a technique of detecting an excessive current flowing through the base of a final-stage amplifier HBT, and cancelling out the excessive current to prevent a collect current from increasing (see, for example, the following Patent Publication 1).

There have also been known a technique of turning off an output transistor when an output current detected at the output transistor is increased up to an overcurrent limit (see, for example, the following Patent Publication 2), and a technique of supplying a feedback current to the base of a final-stage transistor to control the voltage at the collector of the transistor when a voltage equal to or greater than a given value is applied to the collector (see, for example, the following Patent Publication 3).

[Patent Publication 1]

Japanese Patent Publication No. 2002-76791 titled "Power Amplifier Module" (claim 1 and FIG. 1)

[Patent Publication 2]

Japanese Patent Publication No. 2003-78362 titled "Power Semiconductor Device" (paragraph [0020] and FIG. 1)

[Patent Publication 3]

Japanese Patent Publication No. 2000-341052 titled "Power Amplifier Protection Circuit" (claim 1 and FIG. 1)

All of the techniques disclosed in the above Patent Publications are designed to detect a collector or base current to a transistor. Thus, these techniques cannot prevent thermal breakdown of the transistor due to over output of the transistor itself

SUMMARY OF THE INVENTION

In view of the above circumstances, it is therefore an object of the present invention to provide a protection circuit for a power amplifier, which operates in response to an over output in an output-stage transistor to reduce the output of the transistor.

In order to achieve the above object, according to the present invention, there is provided an output overvoltage protection circuit for a power amplifier, including a monitor circuit for monitoring an output overvoltage of an output transistor in either one of a plurality of stages (preferably, the final stage) of the power amplifier and allowing a current to flow therethrough in response to the monitored output overvoltage, and a current mirror circuit for supplying a current proportional to the current from the monitor circuit in such a manner that the base bias of the first-stage transistor of the power amplifier is reduced in response to the current supplied from the current mirror circuit, to reduce the output of the final-stage output transistor.

According to the present invention, in response to the monitored output overvoltage of the transistor in either one of the stages (preferably, the final stage) of the power amplifier, the bias of the first-stage transistor is reduced to control the output of the power amplifier. Thus, if an over output is generated in the final-stage transistor due to load change in power-supply overvoltage conditions, the bias of the first-stage transistor can be controlled to immediately suppress the over output of the final-stage transistor so as to avoid the risk of thermal breakdown in the final-stage transistor.

Other features and advantages of the present invention will be apparent from the accompanying drawings and from the detailed description.

DESCRIPTION OF THE PREFERRED EMBODIMENT

With reference to the accompanying drawings, various embodiments of the present invention will now be described.

First Embodiment

Figure 1:
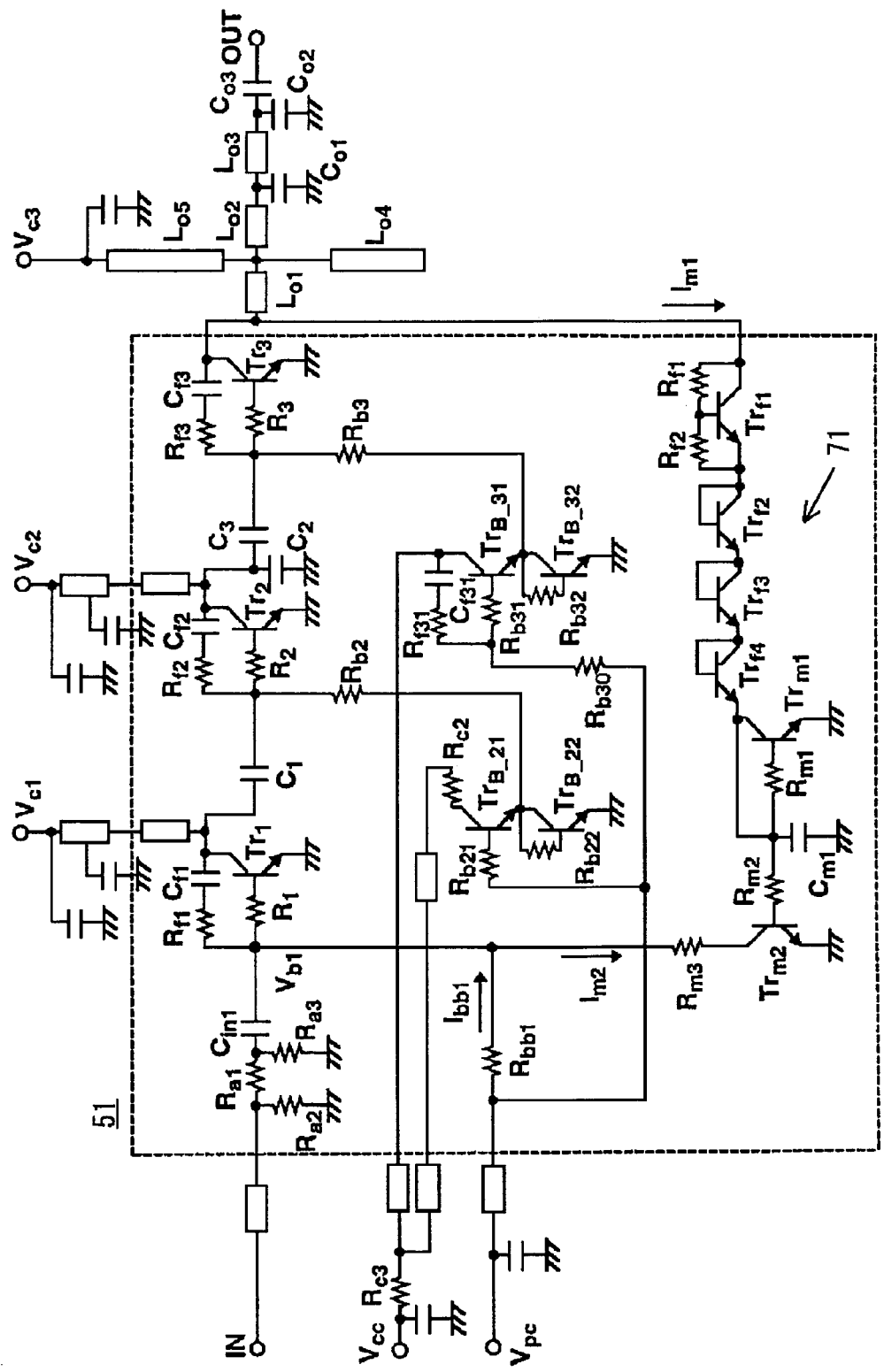
FIG. 1 is a circuit diagram of a power amplifier with an output overvoltage protection circuit according to a first embodiment of the present invention.

FIG. 1 shows a circuitry of a GSM power amplifier with an output overvoltage protection circuit according to a first embodiment of the present invention. A signal entered into an input terminal IN is amplified through three amplifier HBTs (hereinafter referred to as "transistors") Tr1 to Tr3 in this order. A voltage Vpc supplied to an output-power control terminal acts to supply a base current (bias) to the transistor Tr1 and to supply a base current to the transistors Tr2, Tr3, respectively, through transistors (TrB_21, TrB_22) and transistors (TrB_23, TrB_24) which are fed from an voltage Vcc at a power supply terminal, so as to variably control the output of the final-stage transistor Tr3. The output of the final-stage transistor Tr3 is led to an output terminal OUT through microwave lines Lo 1 to Lo 5.

Each of the transistors Tr1 to Tr3 has characteristics of providing a high low-frequency gain, and easily oscillating at a low frequency as compared to a FET power amplifier. Thus, RC feedback circuits (Rf1-Cf1), (Rf2-Cf2), (Rf3-Cf3) are applied to the transistors Tr1, Tr2, Tr3, respectively. A conventional GSM power amplifier has the above circuit configuration. As mentioned above, the conventional GSM power amplifier employing no isolator is likely to cause breakdown of the final-stage transistor Tr3 due to sudden change in load impedance during high voltage application. With the object of solving this problem, in the first embodiment, a protection circuit 71 including a monitor circuit and current mirror circuit is additionally employed.

The monitor circuit includes four transistors Trf1 to Trf4 connected in series with each other. Each of the transistors Trf1 to Trf4 has a base connected to its collector, and the transistor Trf1 is configured as a Vbe multiplyer using resistors Rf1, Rf2. The collector of the transistor Trf1 is connected to the collector of the final-stage transistor Tr3. The emitter of the transistor Trf4 is connected to the collector of a transistor Trm1 serving as one of two transistors in a current mirror configuration. The collector of the other transistor Trm2 is connected to the base of the first-stage transistor Tr1 through a resistor Rm3.

The operation of this protection circuit 71 will be described below. The transistors Trf1 to Trf4, Trm1 monitors an amplitude voltage greater than a given voltage with respect to the output voltage (or amplitude voltage) of the transistor Tr3. For example, given that the final-stage transistor Tr3 has a safety operation voltage of 12 V or less, the value of the Vbe multiplyer (or the values of Rf1 and Rf2) is set up to allow the monitor circuit (the transistors Trf1 to Trf4, Trm1) to monitor a voltage greater than 12 V and allow a current of I m1 to flow through the monitor circuit in response to the monitored voltage of greater than 12 V.

In this case, when the power amplifier is operated in power-supply overvoltage and load change (output load mismatch) conditions and the load voltage of the collector of the transistor Tr3 becomes greater than 12 V, the current I m1 flows through the transistors Trf1, Trf2 to Trf4. Thus, a mirror current I m2 flows through the transistor Trm2. While the current I m1 is a pulsating current, it is smoothed by resisters Rm1, Rm2 and capacitor Cm1, and therefore the current I m2 becomes a DC current formed by fairly eliminating AC components from the current I m1. The protection circuit is designed to selectively determine the values of the resistors Rm1, Rm2, Rm3, the emitter area ratio of the transistor Trm1 to the transistor Trm2, and/or the stage number of Trf2–Trf4 so as to change the respective values of the currents I m1, I m2 to obtain a desired feedback amount.

As seen in FIG. 1, the first-stage transistor Tr1 is biased by the voltage Vpc through a resistor Rbb1. Thus, in a normal condition where no current I m2 flows, given that any voltage drop due to a base resistor R1 is ignored, and a control current to be supplied to the base of the transistor Tr1 is represented by Ibb1, a bias voltage Vb1 of the transistor Tr1 is expressed by the following formula: Vb1=Vpc−(Rbb1×Ibb1). When the current I m2 flows as a result of load change, the bias voltage Vb1 is reduced to a value expressed by the following formula: Vb1=Vpc−[Rbb1×(Ibb1+I m2)]. Thus, the collector current of the first-stage transistor Tr1 is reduced to provide a lowered output power of the transistor Tr1. The lowering in the output power of the first-stage transistor Tr1 leads to lowering in the output power of the entire power amplifier, so that the final-stage transistor Tr3 has a lowered output voltage.

Figure 15:
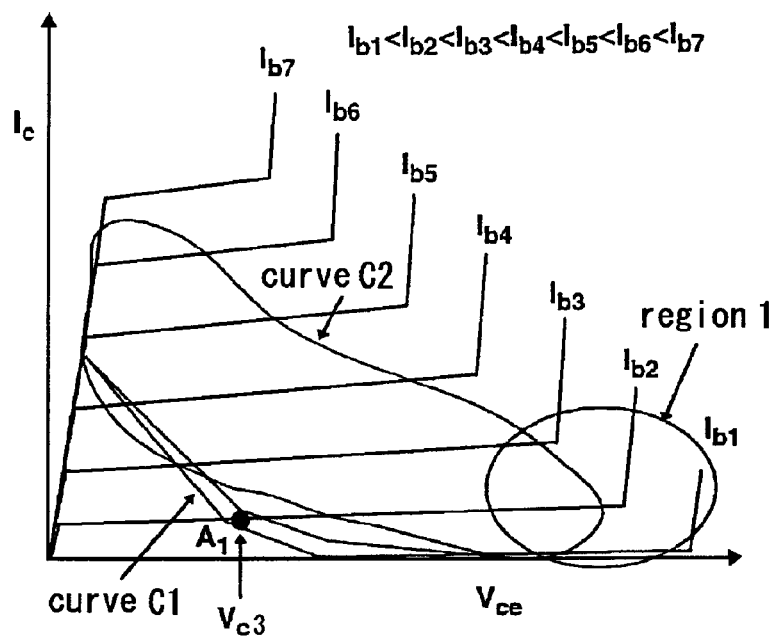
FIG. 15 is a graph showing an Ic-Vce characteristic and a load curve of a final-stage transistor.

FIG. 15 shows an Ic-Vce characteristic and a load curve of the final-stage transistor Tr3. In FIG. 15, A1 indicates a bias point at a regular voltage Vc3 (e.g. 3.2 V). The curve C1 is one example of a load curve when an impedance of a load connected to the output terminal OUT is 50 Ω. The curve C2 is one example of the load curve when a load impedance is changed from 50 Ω (for example, under mismatch conditions, such as a voltage standing wave ratio in the range of 8:1 to 10:1, the load impedance of 50 Ω provides a voltage standing wave ratio of 1:1).

When the voltage standing wave ratio of a load is increased (the output match is changed to a mismatch condition), the load curve is largely changed, and a maximum collector voltage Vce gets close to a breakdown voltage of the final-stage transistor Tr3, as indicated by the region 1 in FIG. 15.

Figure 16:
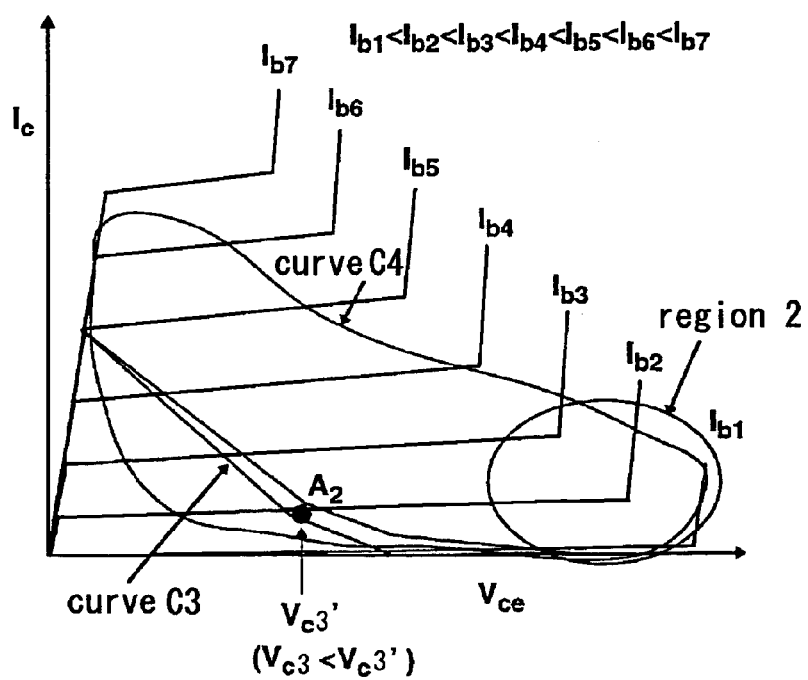
FIG. 16 is a graph showing an Ic-Vce characteristic and a load curve of a final-stage transistor in a conventional power amplifier during output load mismatch.

FIG. 16 shows an Ic-Vce characteristic and a load curve of a final-stage transistor in a conventional power amplifier in case where a power supply voltage Vc3' (e.g. 5.0 V) greater than the regular voltage Vc3 is applied. A2 indicates a bias point at a voltage Vc3'. In this case, the load curve is expanded as indicated by the curve C4, and the maximum collector voltage Vce goes beyond the breakdown voltage (correctly, the safe operation range of the final-stage transistor) in the region 2 indicated in FIG. 16, to run into the breakdown of the final-stage transistor.

By contrast, in the first embodiment, if a voltage greater than 12 V is just about outputting to the collector of the final-stage transistor Tr3, the output voltage can be immediately reduced by the protection circuit as described above. Thus, a load curve is not expanded as in the curve 4 of FIG. 16, and the maximum collector voltage Vce never goes beyond the breakdown voltage.

This function is equivalent to that of achieving a reduced power gain of the entire power amplifier. The efficiency and output of the power amplifier is almost never deteriorated because the protection circuit 71 is not operated under the condition of the standard operating voltage Vc3 (e.g. 3.2 V). As shown in FIG. 1, four base-emitter voltages Vbe of the transistors Trf2 to Trf4, Trm1 are provided on the side to which the current I m1 is entered. This arrangement is intended to almost prevent any current I m1 from flowing when Vpc is 0 (zero) V even if the power supply voltage of the power amplifier increased up to 4.5 V In the GSM application where a power supply terminal of a power amplifier is connected directly to a battery, if the number of the transistors is three or less, the total of the base-emitter voltages or 3×Vbe will become less than 4.5 V to cause the flow of the I m1. The above description has been made on the assumption that Vbe per transistor subject to the I m1 is about 1.5 V.

As mentioned above, the output overvoltage protection circuit 71 for a power amplifier according to the first embodiment can prevent failure or breakdown of a transistor in power-supply overvoltage conditions or output-load mismatch conditions without sacrificing the characteristics in 3V systems designed for a low power supply voltage (standard operating voltage). In addition, the protection circuit 71 can be advantageously configured by primarily using the same active and passive elements as those of the power amplifier 51.

Second Embodiment

Figure 2:
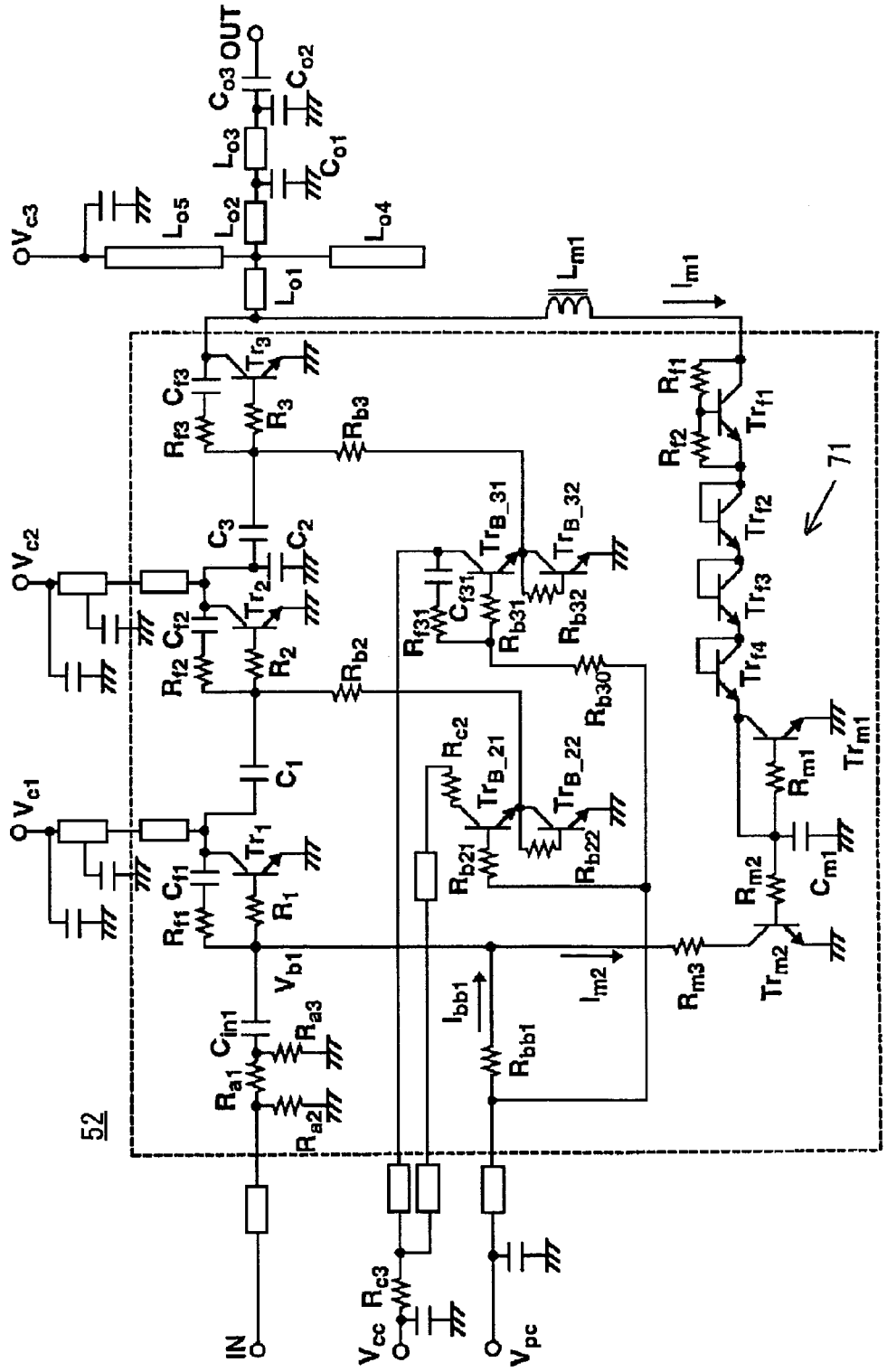
FIG. 2 is a circuit diagram of a power amplifier with an output overvoltage protection circuit according to a second embodiment of the present invention.

FIG. 2 shows a power amplifier 52 with an output overvoltage protection circuit according a second embodiment of the present invention. In addition to the circuitry in FIG. 1, the power amplifier 52 includes an RF blocking inductor Lm1 inserted into a line connecting between the collector of the final-stage transistor Tr3 and the collector of the transistor Trf1 in the output-voltage feedback section.

In the circuitry of FIG. 1, if the voltage smoothing in the current mirror section is not sufficient, ripples to be varied according to operating frequencies will be included in the current I m2. This creates a parasitic oscillation loop such that the bias of the first-stage transistor Tr1 is slightly changed and this slight change causes a subtle change in the output voltage.

In particular, when the power amplifier has a high small signal gain, the above parasitic oscillation becomes significant. Therefore, it is required to design the power amplifier while sufficiently taking account of the measure for preventing the parasitic oscillation caused by providing the feedback circuit according to the present invention. The inductor Lm1 provided in the protection circuit in FIG. 2 can smooth the current I m1 flowing through the feedback circuit to allow the current I m2 to be further smoothed so as to effectively suppress the above parasitic oscillation. This protection circuit also has the same effects as those in the first embodiment.

Third Embodiment

Figure 3:
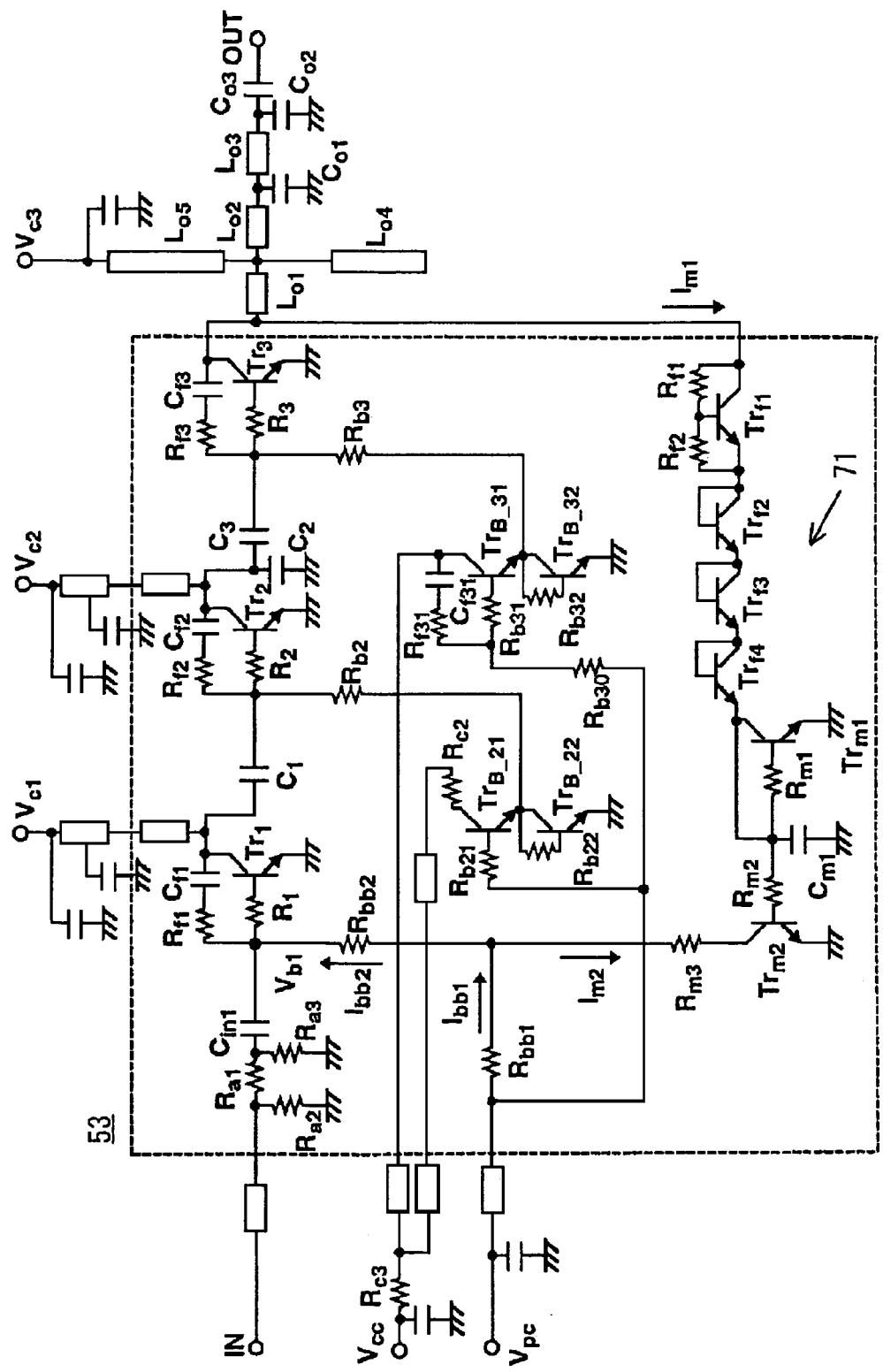
FIG. 3 is a circuit diagram of a power amplifier with an output overvoltage protection circuit according to a third embodiment of the present invention.

As with the second embodiment, a protection circuit according to a third embodiment is directed to suppress the parasitic oscillation. While the circuitry in FIG. 1 is configured such that the feedback output from the transistor Trm2 in the feedback circuit is fed back directly to the feedback section of the first-stage transistor Tr1, the feedback output is fed back through a resistor Rbb2 in a power amplifier 53 in FIG. 3 illustrating the third embodiment.

This configuration can reduce ripples included in the current I m2 to suppress the parasitic oscillation as with the second embodiment. This protection circuit also has the same effects as those in the first embodiment.

Fourth Embodiment

Figure 4:
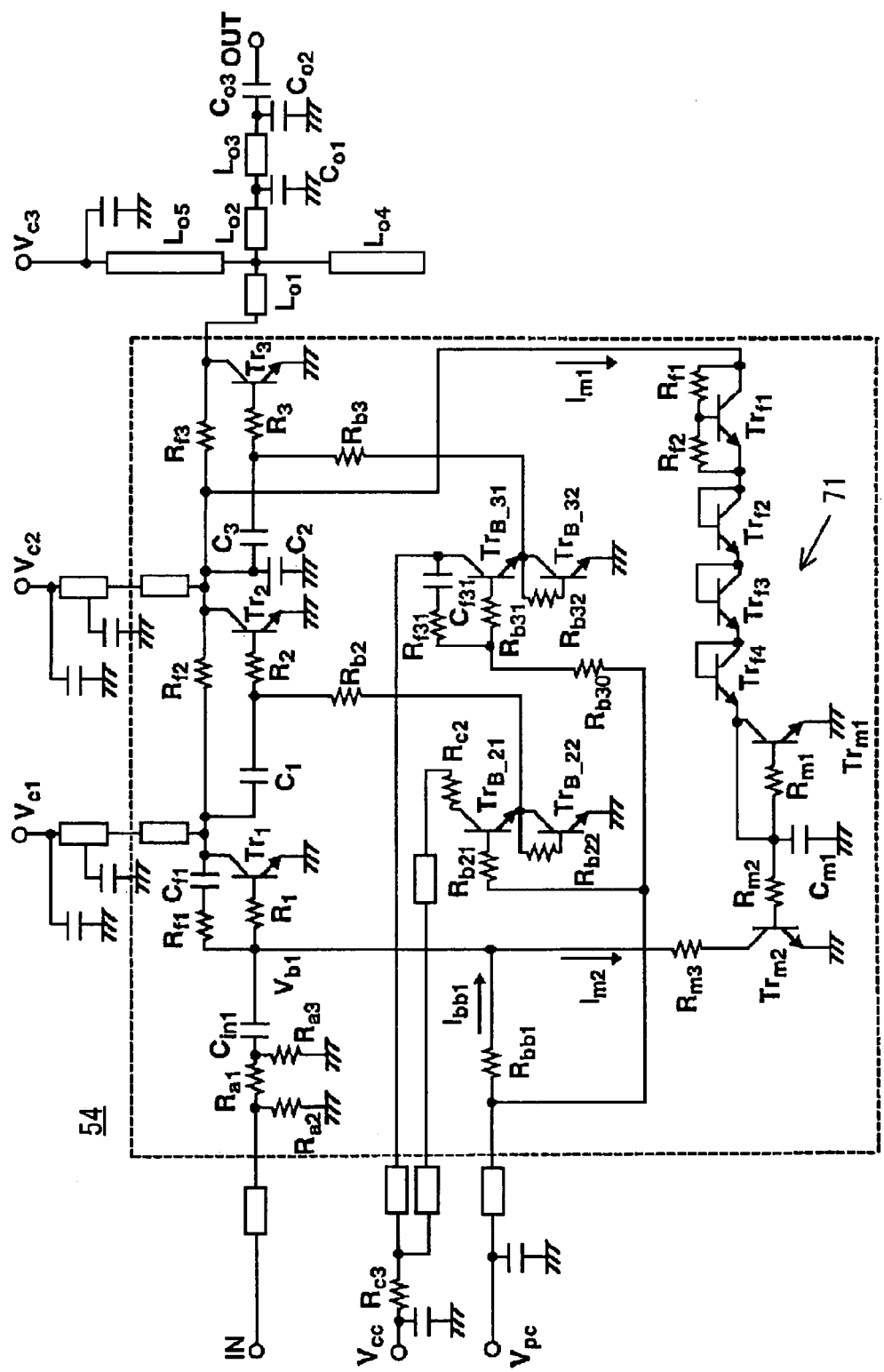
FIG. 4 is a circuit diagram of a power amplifier with an output overvoltage protection circuit according to a fourth embodiment of the present invention.

While the circuitry in FIG. 1 is configured such that the monitor end of the protection circuit 71 is set at the collector of the final-stage transistor Tr3, the monitor end is set at the collector of the second-stage transistor Tr2 in a power amplifier 54 in FIG. 4 illustrating a fourth embodiment. Further, while the circuitry in FIG. 1 is configured such that the feedback resistors Rf2, R13 are connected, respectively, to the bases of the second-stage and final-stage transistors Tr2, Tr3 through the capacitors Cf2, Cf3, the circuitry in FIG. 4 is configured such the feedback resistor Rf2 is connected between the collector of the transistor Tr2 and the collector of the transistor Tr1, and the feedback resistor Rf3 is connected between the collector of the transistor Tr3 and the collector of the transistor Tr2. In the fourth embodiment illustrated in FIG. 4, interstage capacitors C1, C3 carry out the function of the capacitors Cf2, Cf3 in FIG. 1.

In order to adjust the feedback amount to the protection circuit 71, the respective values of the resistors Rm1, Rm2, Rm3, and/or the emitter area ratio of the transistor Trm1 to the transistor Trm2 may be altered as with the first to third embodiments.

As compared to the circuitry in FIG. 1, the fourth embodiment in FIG. 4 has a larger change in the collector voltage of the transistor Tr2 (larger expansion in the load curve of the transistor Tr2). This allows the monitor end of the protection circuit 71 to be set at the second-stage transistor Tr2 instead of the final-stage transistor Tr3. The fourth embodiment can achieve an enhanced effect of suppressing the parasitic oscillation as compared to the first to third embodiments because the gain between the transistors Tr1–Tr2 is less than that between the transistors Tr1–Tr3. This protection circuit also has the same effects as those in the first embodiment.

Fifth Embodiment

Figure 5:
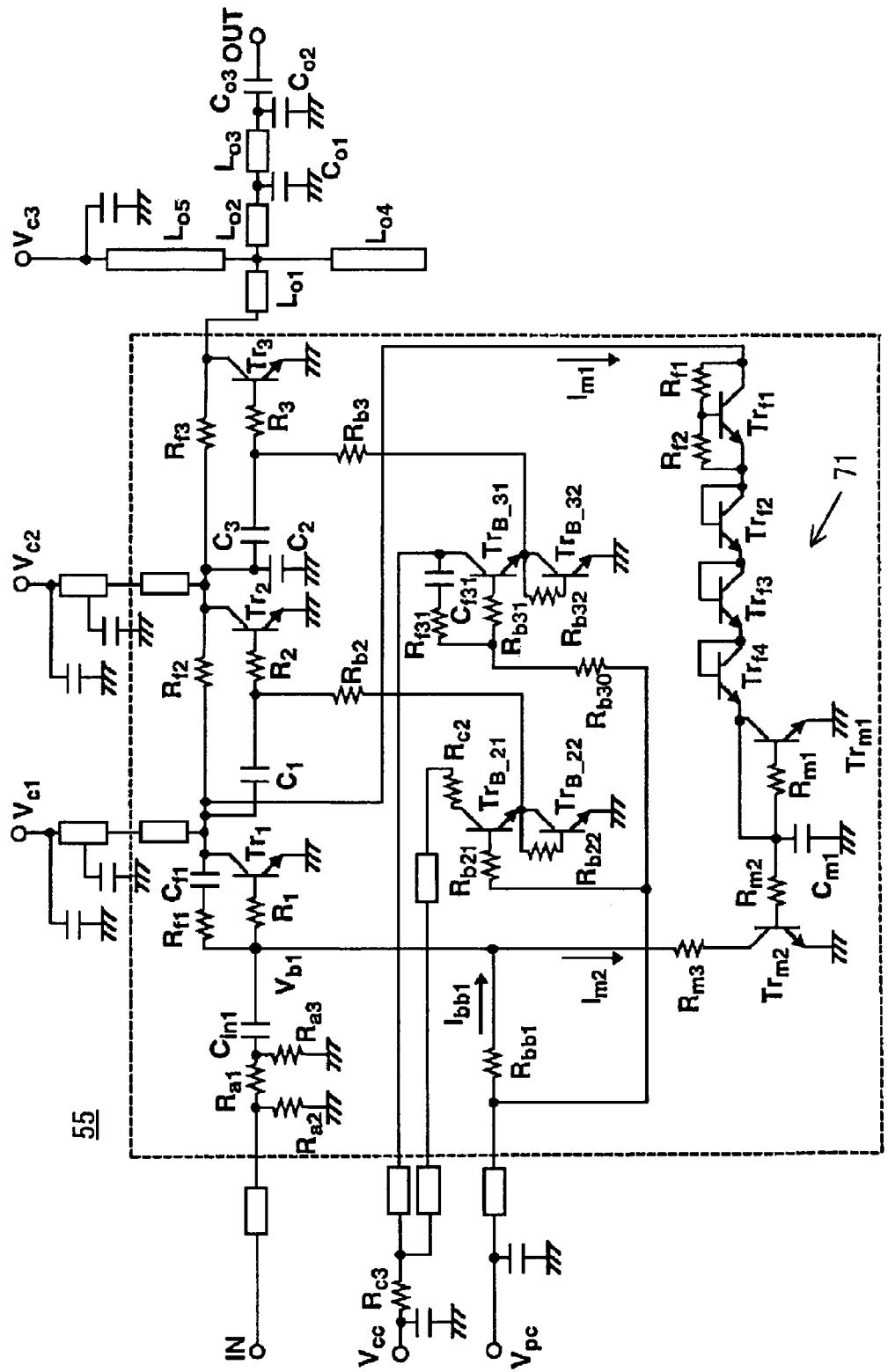
FIG. 5 is a circuit diagram of a power amplifier with an output overvoltage protection circuit according to a fifth embodiment of the present invention.

While the circuitry in FIG. 4 is configured such that the monitor end of the protection circuit is set at the collector of the second-stage transistor Tr2, the monitor end is set at the collector of the first-stage transistor Tr1 in a power amplifier 55 in FIG. 5 illustrating a fifth embodiment. The circuitry in FIG. 5 also employs five transistors Trf1 to Trf4, Trm1 on the monitor side of the protection circuit 71 as with the first to fourth embodiments. The number of these transistors, the values of the resistors Rm1, Rm2, Rm3, and/or the emitter area ratio of the transistor Trm1 to the transistor Trm2 may be selectively determined to obtain a desired feedback amount.

The fifth embodiment can achieve an enhanced effect of suppressing the parasitic oscillation as compared to the first to fourth embodiments because the gain of the transistor Tr1 is than that of the entire power amplifier in the fourth embodiment. This protection circuit also has the same effects as those in the first embodiment.

Sixth Embodiment

Figure 6:
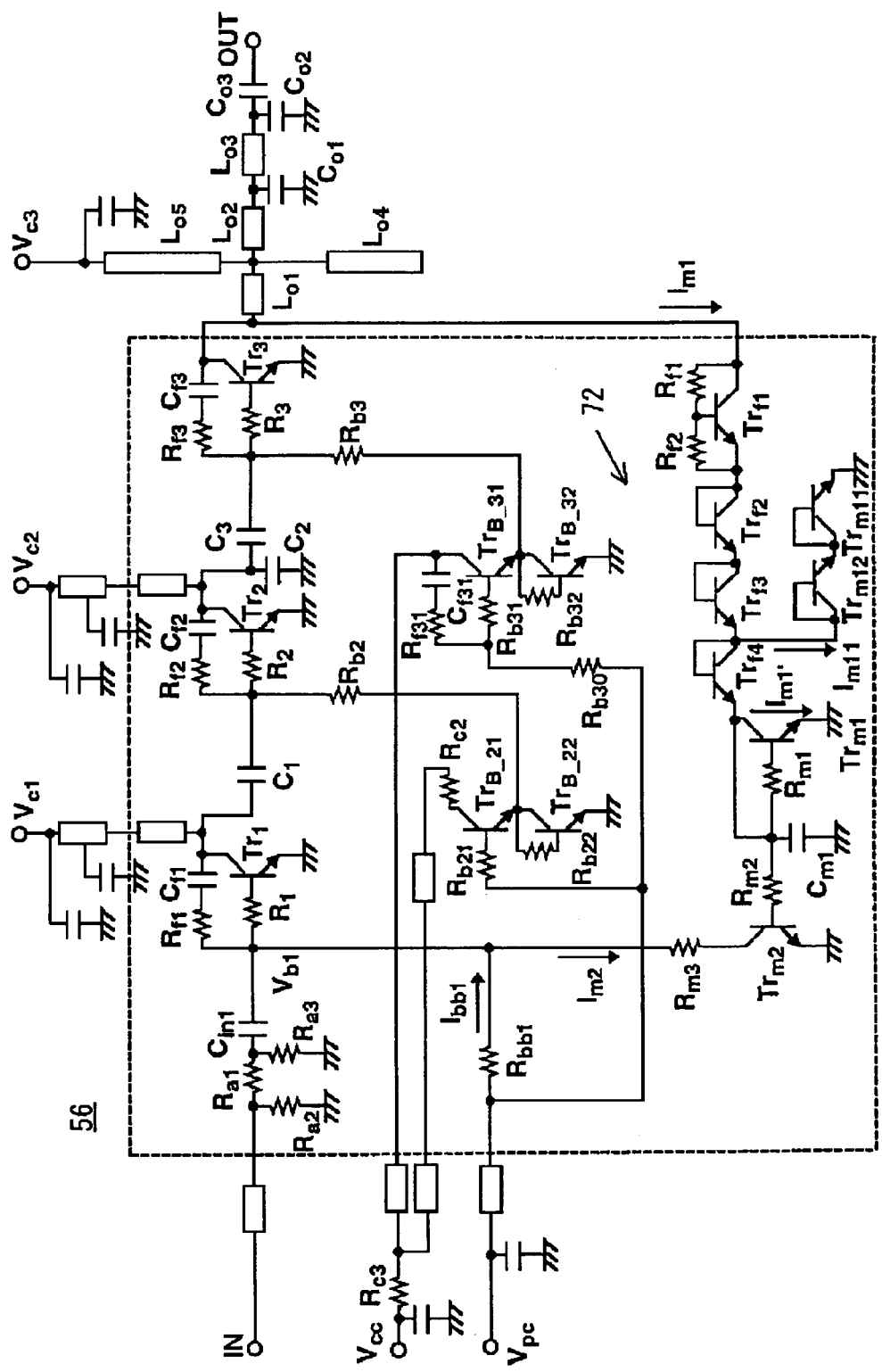
FIG. 6 is a circuit diagram of a power amplifier with an output overvoltage protection circuit according to a sixth embodiment of the present invention.

In the first embodiment, if the monitor current I m1 of the protection circuit has an excessively large value, the feedback amount will not be able to be adjusted only by altering the values of the resistors Rm1, Rm2, Rm3, the emitter area ratio of the transistor Trm1 to the transistor Trm2, and/or the number of transistors Trf2–Trf4 in some cases. From this point of view, in a power amplifier 56 in FIG. 6 illustrating a sixth embodiment, two transistors Trm11, Trm12 connected in series with one another are connected in parallel to the transistor Trf4 to serve as a monitor circuit of a protection circuit 72.

Thus, a current I m1' flowing through the transistor Trm1 is reduced by a factor of a shunt current I m1' to the transistors Trm11, Trm12, so that the feedback amount can be adjusted even in the aforementioned situation. This protection circuit also has the same effects as those in the first embodiment.

Seventh Embodiment

Figure 7:
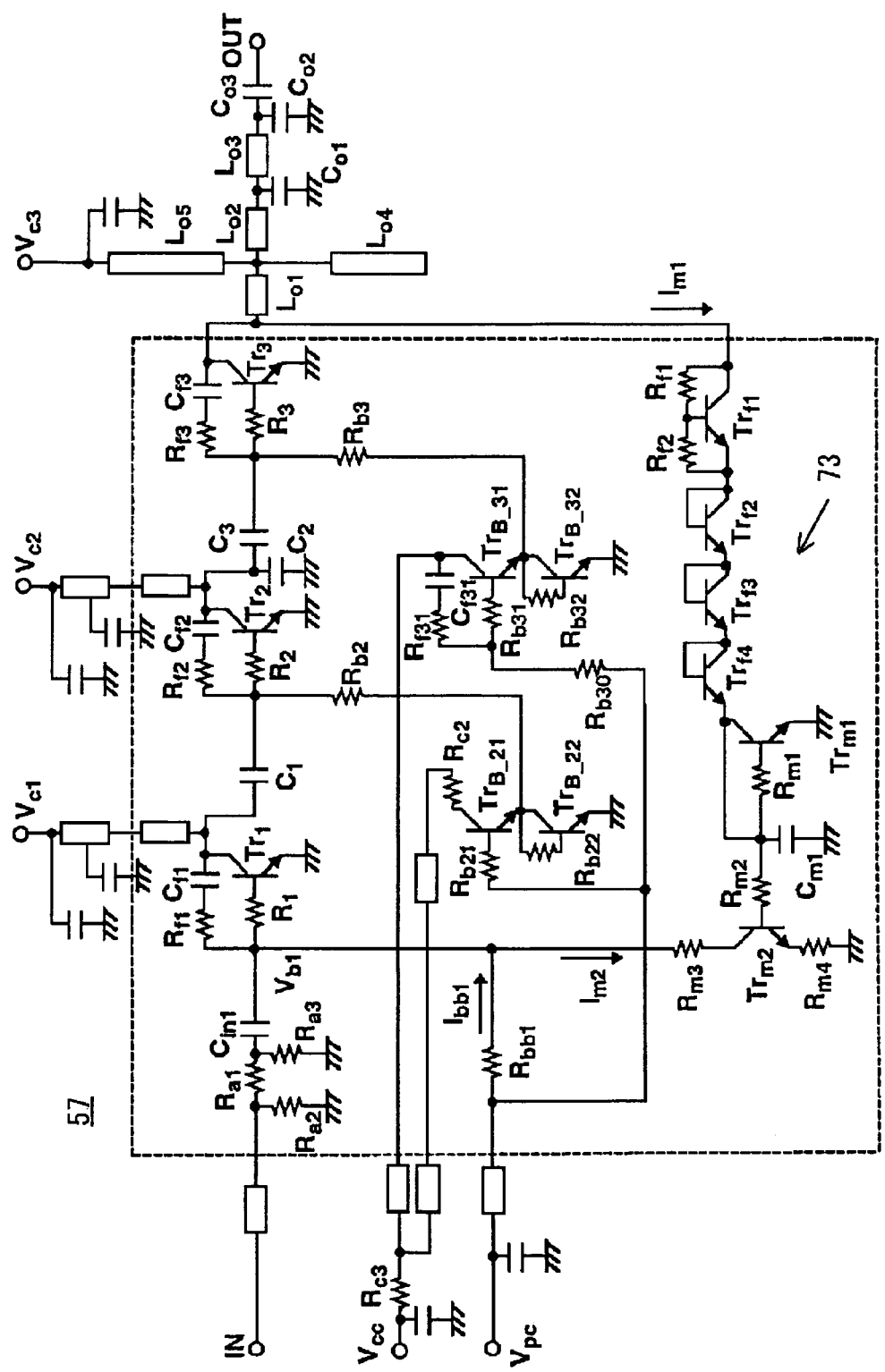
FIG. 7 is a circuit diagram of a power amplifier with an output overvoltage protection circuit according to a seventh embodiment of the present invention.

As with the sixth embodiment, in order to cope with the situation where, due to the excessive monitor current I m1 of the protection circuit, the feedback amount cannot be adjusted only by altering the values of the resistors Rm1, Rm2, Rm3, the emitter area ratio of the transistor Trm1 to the transistor Trm2, and/or the number of transistors Trf2–Trf4, a power amplifier 57 in FIG. 7 illustrating a seventh embodiment includes a resistor Rm4 inserted in the emitter of the transistor Trm2 of the current mirror circuit.

According to this circuitry, the current I m2 flowing through the transistor Trm2 in response to the current I m1 in a protection circuit 73 becomes less that than in the circuitry in FIG. 1, so that the feedback amount can be adjusted even in the aforementioned situation. This protection circuit also has the same effects as those in the first embodiment.

Eighth Embodiment

Figure 8:
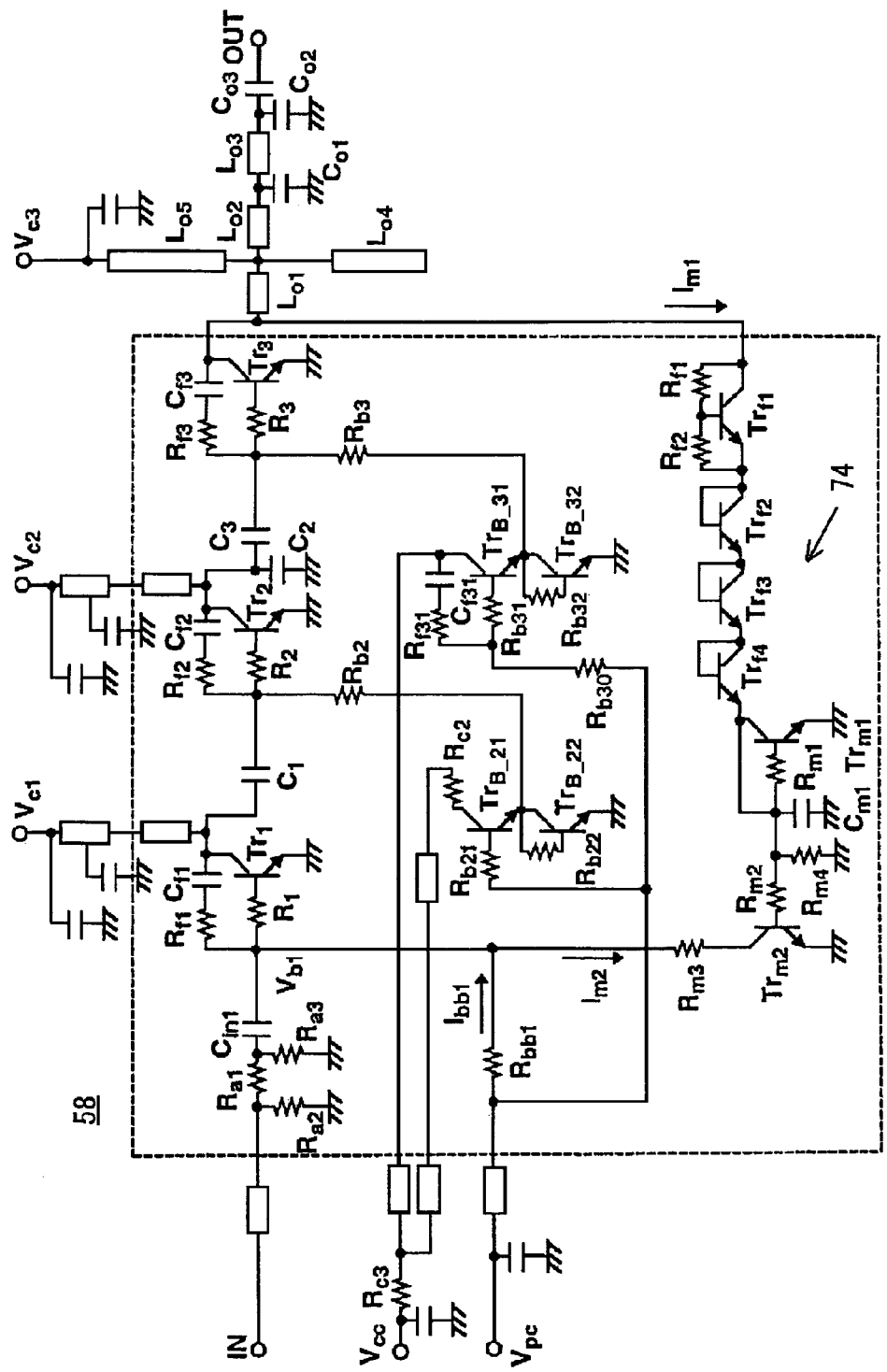
FIG. 8 is a circuit diagram of a power amplifier with an output overvoltage protection circuit according to an eighth embodiment of the present invention.

As with the sixth embodiment, in order to cope with the situation where, due to the excessive monitor current I m1 of the protection circuit, the feedback amount cannot be adjusted only by altering the values of the resistors Rm1, Rm2, Rm3, the emitter area ratio of the transistor Trm1 to the transistor Trm2, and/or the number of transistors Trf2–Trf4, a power amplifier 58 in FIG. 8 illustrating an eighth embodiment includes a resistor Rm4 inserted into a GND line which is connected to a node connecting the bases of the transistors Trm1, Trm2 of the current mirror circuit terminal through the respective base resistors thereof, in parallel with the smoothing capacitor Cm1.

According to this circuitry, the current I m2 flowing through the transistor Trm2 in response to the current I m1 in a protection circuit 74 becomes less than that in the circuitry in FIG. 1, so that the feedback amount can be adjusted even in the aforementioned situation. This protection circuit also has the same effects as those in the first embodiment.

Ninth Embodiment

Figure 9:
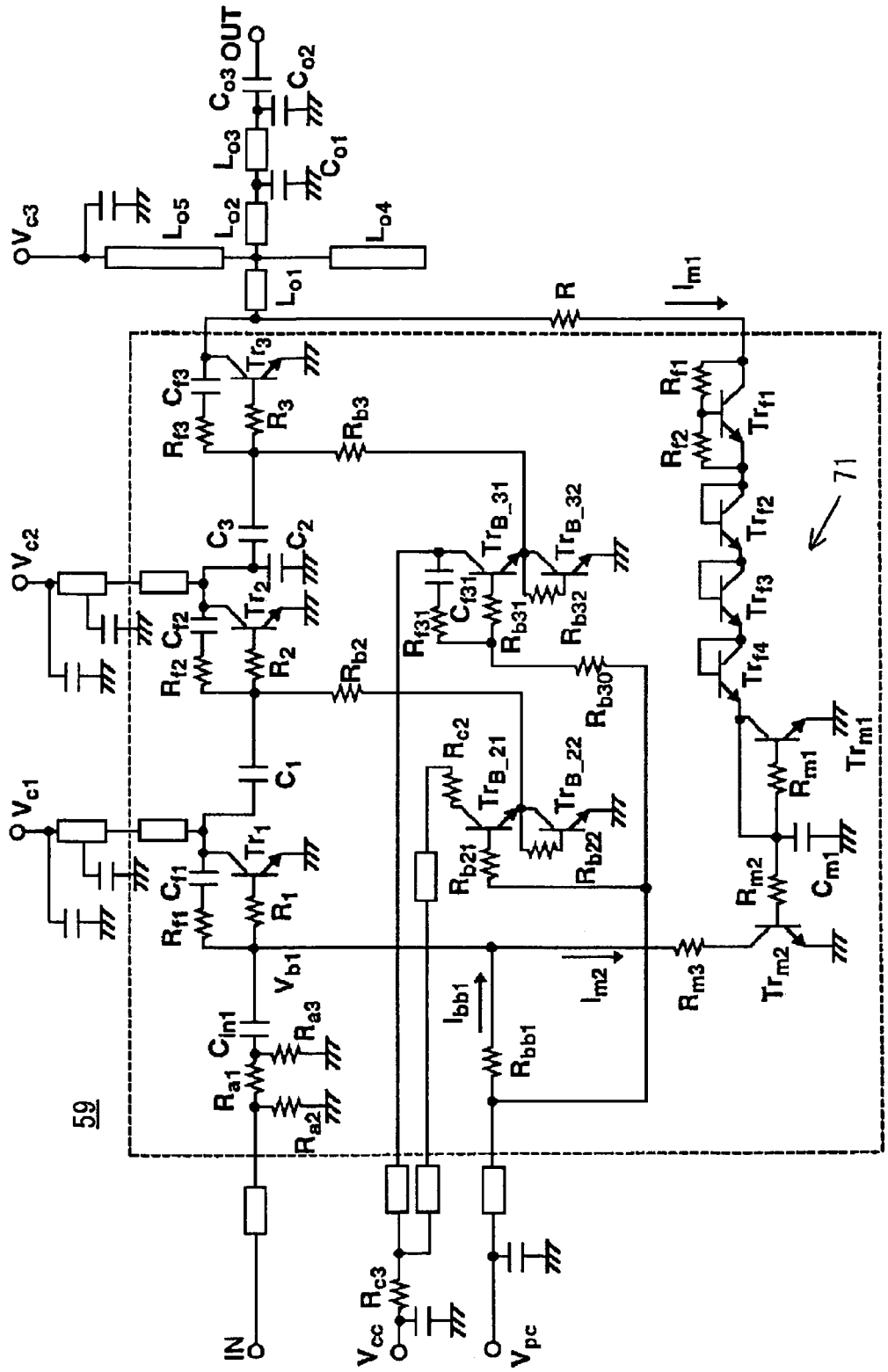
FIG. 9 is a circuit diagram of a power amplifier with an output overvoltage protection circuit according to a ninth embodiment of the present invention.

A power amplifier 59 in FIG. 9 illustrating a ninth embodiment employs a resistor R in place of the inductor Lm1 in FIG. 2. In the ninth embodiment, the collector voltage is regulated by a set value (n Vbe) of Vbe multiplyer of the transistor Trf1, the total Vbe number 4 of the diode-connected transistors Trf2 to Trf4 and Trm1, and the register R, to determine a maximum value of the monitor current I m1 in the operation of the protection circuit. Specifically, maximum value of I m1=[collector voltage of Tr3−(n+4) Vbe]/R (wherein n is an integer number of one or more). As with the sixth to eighth embodiments, the ninth embodiment is suitable for use in the case where it is effective to, reduce the monitor current I m1. This protection circuit also has the same effects as those in the first embodiment.

Tenth Embodiment

Figure 10:
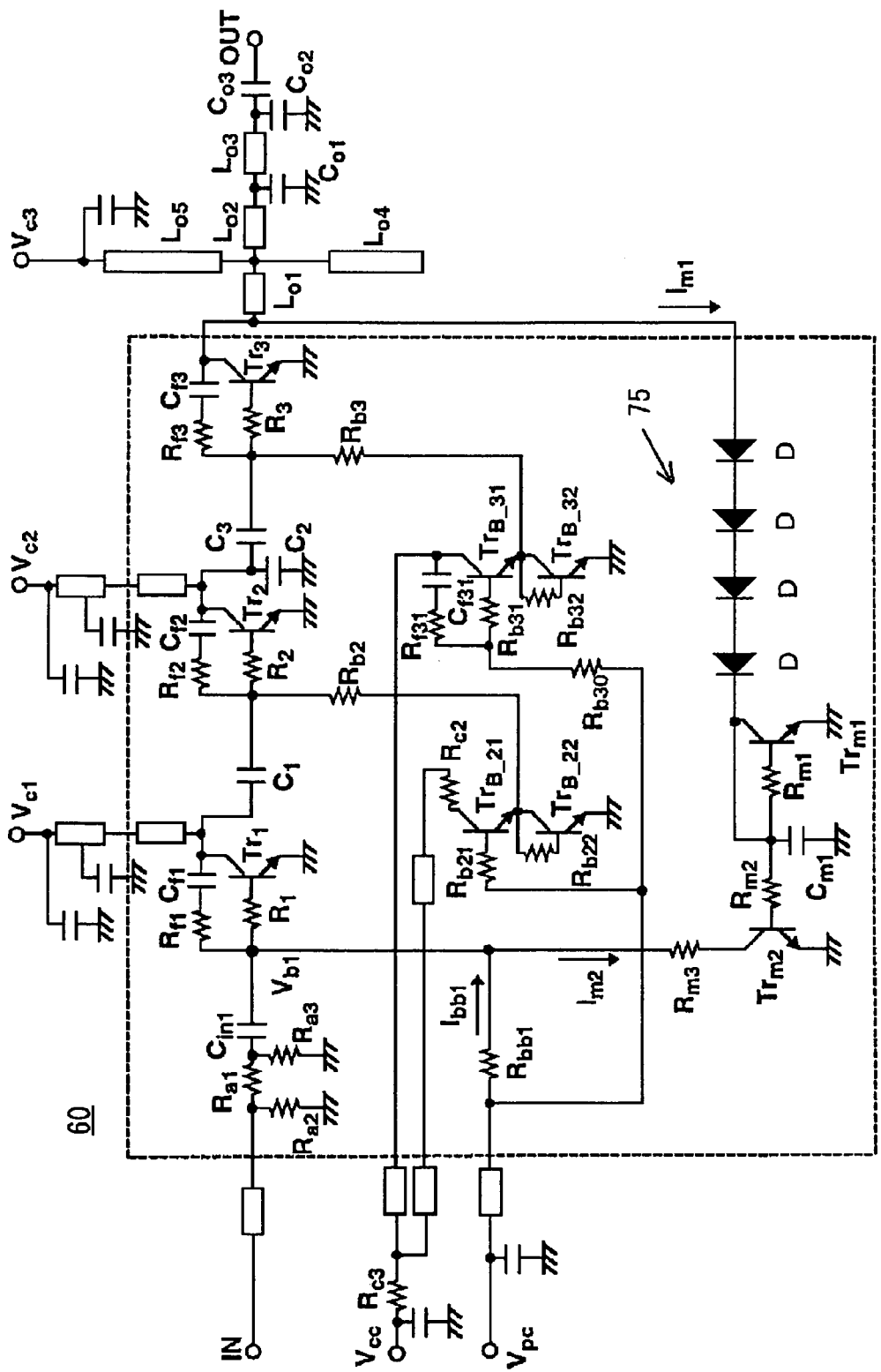
FIG. 10 is a circuit diagram of a power amplifier with an output overvoltage protection circuit according to a tenth embodiment of the present invention.

A power amplifier 60 in FIG. 10 illustrating a tenth embodiment employs a diode D in place of the transistors Trf1 to Trf4 in FIG. 1, in a number N corresponding to the V be number of the transistors Trf1 to Trf4.

While the tenth embodiment has a disadvantage in terms of the occupied area of the diodes, it has the same protection effect in load change as that in the first embodiment. The configuration having the diodes D substituted for the transistors may also be applied to the aforementioned second to ninth embodiments.

Eleventh Embodiment

Figure 11:
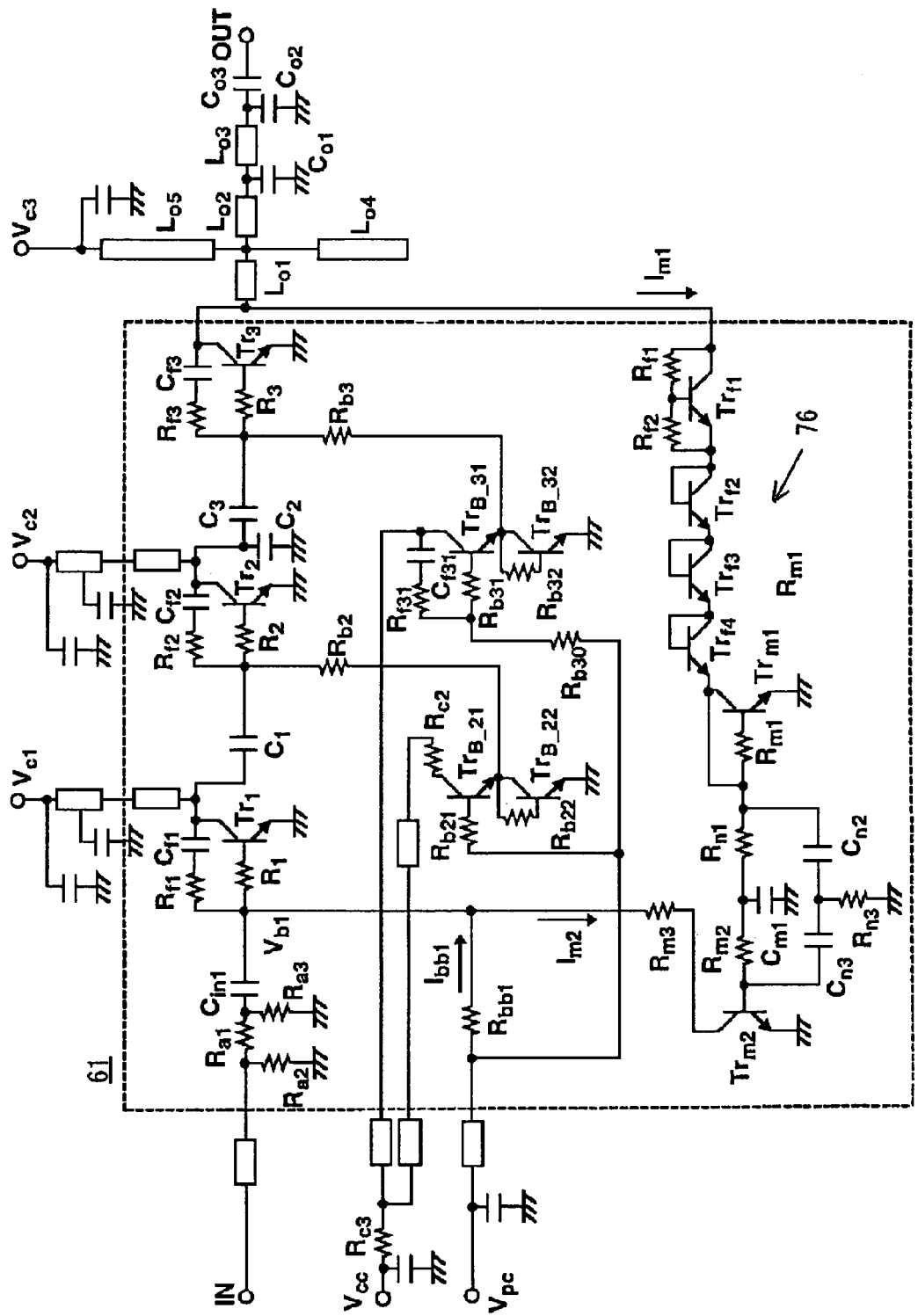
FIG. 11 is a circuit diagram of a power amplifier with an output overvoltage protection circuit according to an eleventh embodiment of the present invention.

In a power amplifier 61 in FIG. 11 illustrating an eleventh embodiment, a current mirror circuit of a protection circuit 76 includes two resistors Rn1, Rn3, and two capacitors Cn2, Cn3 in addition to the current mirror circuit in FIG. 1. The registors Rn1, Rn3, Rm1, and the capacitors Cm1, Cn2, Cn3 make up a notch filter which can apply a great suppression to a frequency fo by setting a constant satisfying the following formulas: Rn1=Rm2=Rn3/2, Cm1=Cn2=C3/2, fo=1/(2πCm1×Rn1). Thus, high frequency components fo included in the monitor current I m1 can be eliminated to convert the monitor current I m1 into a sufficiently smoothed DC current I m2.

The power amplifier 61 in FIG. 11 can prevent failure or breakdown of a transistor in power-supply overvoltage conditions or output-load mismatch conditions without sacrificing the characteristics in 3V systems designed for a low power supply voltage (standard operating voltage). In addition, the protection circuit 76 has advantages of being configured by primarily using the same active and passive elements as those of the power amplifier 61 and effectively suppressing the parasitic oscillation by the RC notch filter.

Twelfth Embodiment

Figure 12:
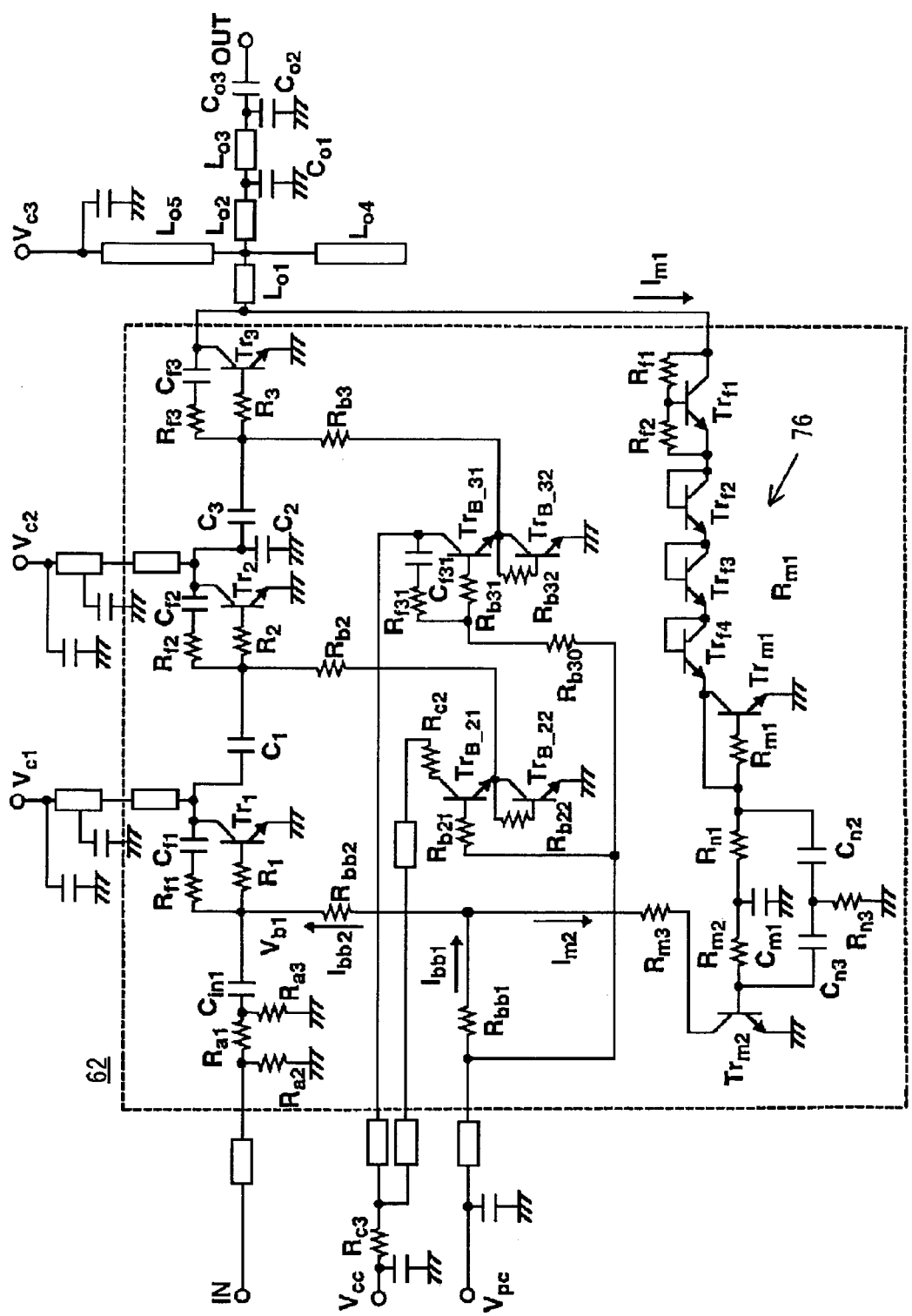
FIG. 12 is a circuit diagram of a power amplifier with an output overvoltage protection circuit according to a twelfth embodiment of the present invention.

While the circuitry in FIG. 11 is configured such that the feedback output is fed back from the transistor Trm2 of the feedback circuit directly to the feedback section of the first-stage transistor Tr1, the feedback output is fed back through the resistor Rbb2 in a power amplifier 62 in FIG. 12 illustrating a twelfth embodiment.

This configuration can more effectively reduce ripples included in the current I m2 as compared to the power amplifier in FIG. 11 to reliably suppress the parasitic oscillation. This protection circuit also has the same effects as those in the first embodiment.

Thirteenth Embodiment

Figure 13:
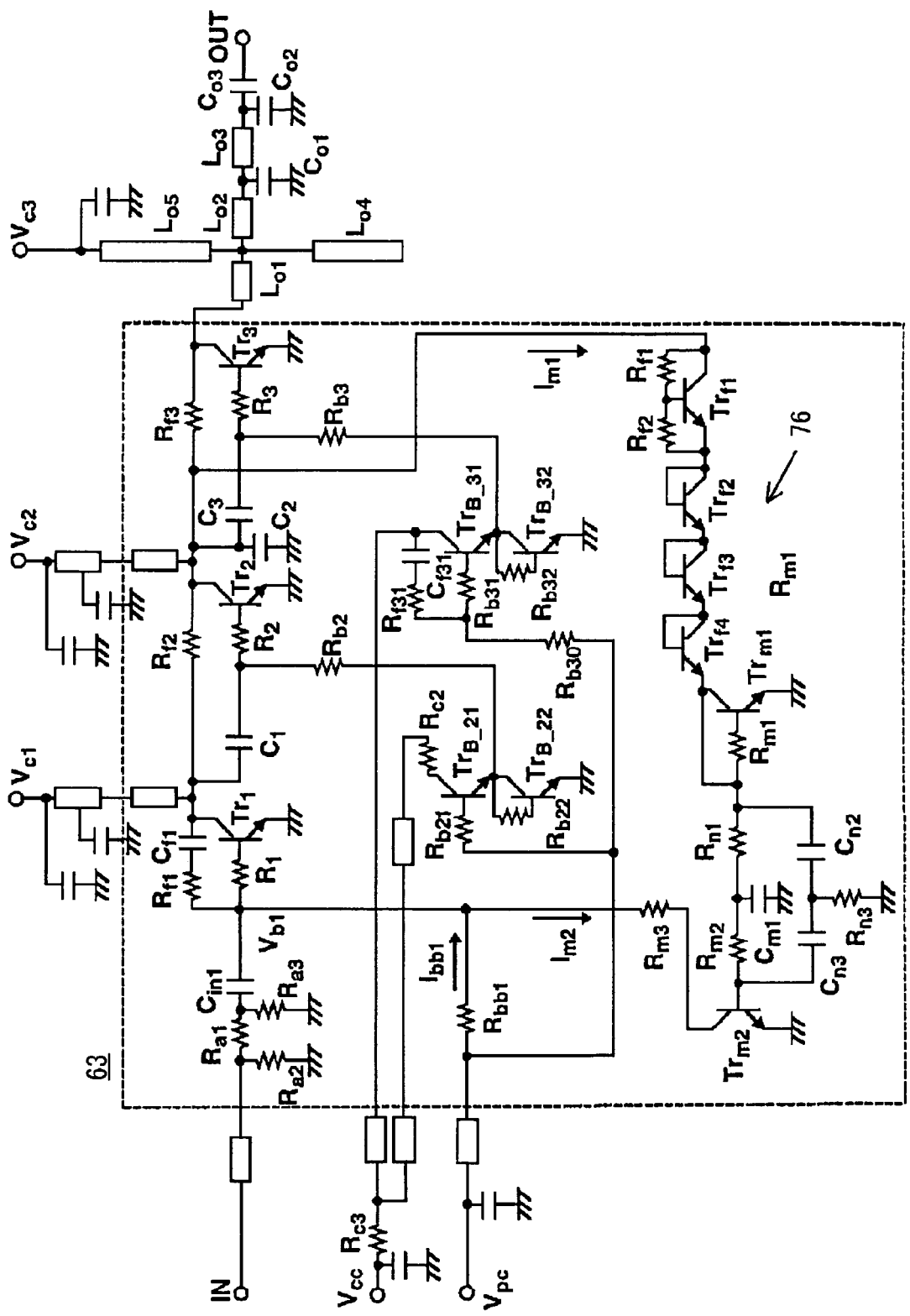
FIG. 13 is a circuit diagram of a power amplifier with an output overvoltage protection circuit according to a thirteenth embodiment of the present invention.

While the circuitry in FIG. 11 is configured such that the monitor end of the protection circuit 76 is set at the collector of the final-stage transistor Tr3, the monitor end is set at the collector of the second-stage transistor Tr2 in a power amplifier 63 in FIG. 13 illustrating a thirteenth embodiment. In connection with this modification, the circuit of the power amplifier 63 is modified in the same manner as described in conjunction with FIG. 4.

As compared to the circuitry in FIG. 11, the thirteenth embodiment in FIG. 13 has a larger change in the collector voltage of the transistor Tr2 (larger expansion in the load curve of the transistor Tr2. This allows the monitor end of the protection circuit 76 to be set at the second-stage transistor Tr2 instead of the final-stage transistor Tr3. The thirteenth embodiment can achieve an enhanced effect of suppressing the parasitic oscillation as compared to the eleventh and twelfth embodiments because the gain between the transistors Tr1–Tr2 is less than that between the transistors Tr1–Tr3. This protection circuit also has the same effects as those in the first embodiment.

Fourteenth Embodiment

Figure 14:
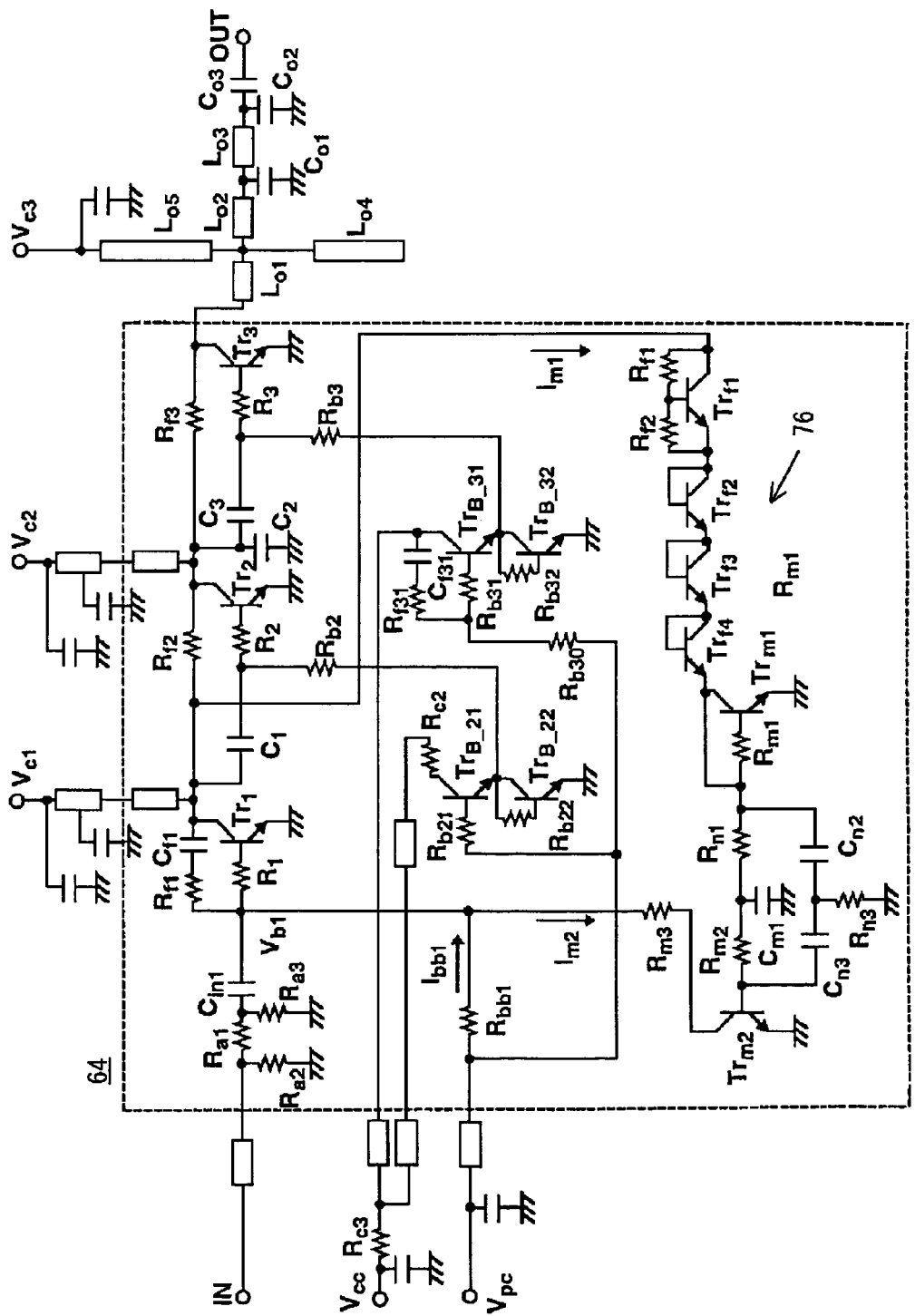
FIG. 14 is a circuit diagram of a power amplifier with an output overvoltage protection circuit according to a fourteenth embodiment of the present invention.

While the circuitry in FIG. 13 is configured such that the monitor end of the protection circuit is set at the collector of the second-stage transistor Tr2, the monitor end is set at the collector of the first-stage transistor Tr1 in a power amplifier 64 in FIG. 14 illustrating a fourteenth embodiment. The circuitry in FIG. 14 also employs five transistors Trf1 to Trf4, Trm1 on the monitor side of the protection circuit 76 as with the eleventh to thirteenth embodiments. The number of these transistors, the values of the resistors Rm1, Rm2, Rm3, and/or the emitter area ratio of the transistor Trm1 to the transistor Trm2 may be selectively determined to obtain a desired feedback amount.

The fourteenth embodiment can achieve an enhanced effect of suppressing the parasitic oscillation as compared to the eleventh to thirteenth embodiments because the gain of the transistor Tr1 is than that of the entire power amplifier in the fourteenth embodiment. This protection circuit also has the same effects as those in the first embodiment.

What is claimed is:

1. An output overvoltage protection circuit for a power amplifier having a plurality of stages, comprising:
   a monitor circuit configured to monitor an output overvoltage of a transistor in one stage of the plurality of stages of said power amplifier, wherein said one stage is not the final stage, and to conduct a current in response to the monitored output overvoltage; and
   a current mirror circuit configured to supply a current proportional to the current from said monitor circuit in such a manner that the bias of a first-stage transistor of said power amplifier is reduced in response to the current supplied from said current mirror circuit.

2. The output overvoltage protection circuit according to claim 1, wherein said monitor circuit monitors the output voltage of a second-stage transistor of said power amplifier.

3. The output overvoltage protection circuit according to claim 1, wherein said monitor circuit monitors the output voltage of the first-stage transistor of said power amplifier.

4. The output overvoltage protection circuit according to claim 1, which includes a smoothing circuit configured to smooth said current from the monitor circuit.

5. The output overvoltage protection circuit according to claim 4, wherein a resistor is connected in parallel with a capacitor which forms said smoothing circuit.

6. An output overvoltage protection circuit for a power amplifier having a plurality of stages, comprising:
   a monitor circuit configured to monitor an output overvoltage of a transistor in one of the plurality of stages of said power amplifier and conduct a current in response to the monitored output overvoltage; and
   a current mirror circuit configured to supply a current proportional to the current from said monitor circuit in such a manner that the bias of a first-stage transistor of said power amplifier is reduced in response to the current supplied from said current mirror circuit,
   wherein RC notch filter is formed in a base part of two transistors included in the current mirror circuit.

7. The output overvoltage protection circuit according to claim 1, wherein said monitor circuit feeds a feedback output to a feedback section through a resistor.

8. An output overvoltage protection circuit for a power amplifier having a plurality of stages, comprising:
   a monitor circuit configured to monitor an output overvoltage of a transistor in one of the plurality of stages of said power amplifier and conduct a current in response to the monitored output overvoltage; and
   a current mirror circuit configured to supply a current proportional to the current from said monitor circuit in such a manner that the bias of a first-stage transistor of said power amplifier is reduced in response to the current supplied from said current mirror circuit,
   wherein said monitor circuit further comprises a circuit configured to shunt an input current provided thereto to reduce current flowing through the current mirror circuit.

9. The output overvoltage protection circuit according to claim 1, wherein an emitter resistor is connected to one of plural transistors included in the current mirror circuit.

10. The output overvoltage protection circuit according to claim 1, wherein the monitor circuit comprises a diode.

* * * * *